(12) United States Patent
Miyata (10) Patent No.: US 6,377,149 B1
(45) Date of Patent: Apr. 23, 2002

(54) MAGNETIC FIELD GENERATOR FOR MAGNETRON PLASMA GENERATION

(75) Inventor: Koji Miyata, Fukui-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/684,323

(22) Filed: Oct. 10, 2000

(51) Int. Cl.[7] .................................................. H01F 7/02
(52) U.S. Cl. ....................................................... 335/306
(58) Field of Search ................................ 335/302–306; 204/298.01, 298.16–298.22, 298.37; 315/111.41–111.71

(56) References Cited

U.S. PATENT DOCUMENTS 3,059,156 A  * 10/1962  Moriya ........................ 335/306
4,265,729 A  *  5/1981  Morrison, Jr. ............... 204/298
5,252,178 A  * 10/1993  Moslehi ........................ 156/643

* cited by examiner

*Primary Examiner*—Ramon M. Barrera
(74) *Attorney, Agent, or Firm*—Wenderoth, Lind & Ponack, L.L.P.

(57) ABSTRACT

An improvement is provided in a dipole-ring magnet as a magnetic field generator in a magnetron plasma treatment apparatus relative to the height of the plane in which the magnetic field consists only of the component in the horizontal direction perpendicular to the length of the magnetically anisotropic columnar segment magnets of which the dipole-ring magnet is constituted. While the height of the plane of horizontal magnetic field is the half height of the length of the segment magnets in a conventional dipole-ring magnet, the plane of horizontal magnetic field shifts downwardly by mounting a ring member of a ferromagnetic material on or above the upper end surfaces of the columnar segment magnets so as to enable a more compact and more economical design of the magnetron plasma treatment apparatus.

10 Claims, 7 Drawing Sheets

MAGNETIC FIELD GENERATOR FOR MAGNETRON PLASMA GENERATION

BACKGROUND OF THE INVENTION

The present invention relates to an improvement in a magnetic field generator for magnetron plasma generation or, more particularly, relates to an improvement in a magnetic field generator of the dipole-ring magnet type in an instrument for magnetron plasma generation employed in the processes of magnetron plasma etching, magnetron plasma sputtering and so on.

It is a conventional practice in the electronic technology for the manufacture of various kinds of electronic devices that the processes of etching and sputtering are conducted by utilizing magnetron plasma which is generated in a magnetron plasma generating apparatus in the following manner.

Namely, electrodes are inserted into the gaseous phase under an appropriately reduced pressure in a chamber filled with a process gas, which is typically a halogen gas for etching and argon gas for sputtering, to cause electric discharge so that the molecules of the gas are ionized to produce secondary electrons which further collide with the gas molecules to further ionize the same. The electrons released by the discharge as well as the secondary electrons are acted on by the magnetic field and electric field generated in the magnetron plasma chamber to enter a drift movement.

The electrons thus under the drift movement further collide consecutively with the gas molecules resulting anew in releasing of secondary electrons which can again ionize gas molecules. Accordingly, magnetron plasma is advantageous in respect of the high efficiency for the ionization of gas molecules by virtue of the above mentioned repetition of the unit processes.

Figure 3A:
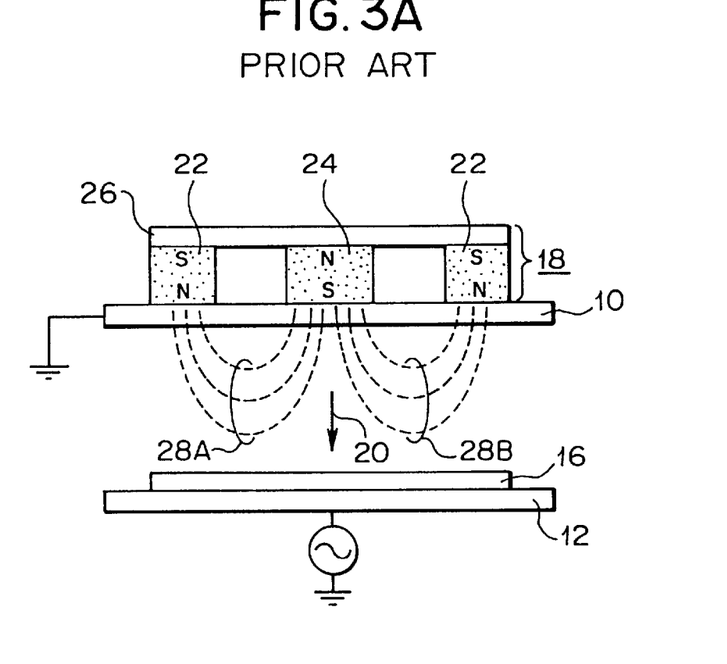
FIG. 3A is an axial cross sectional view of a conventional magnetic field generator showing the lines of magnetic force.
Figure 3B:
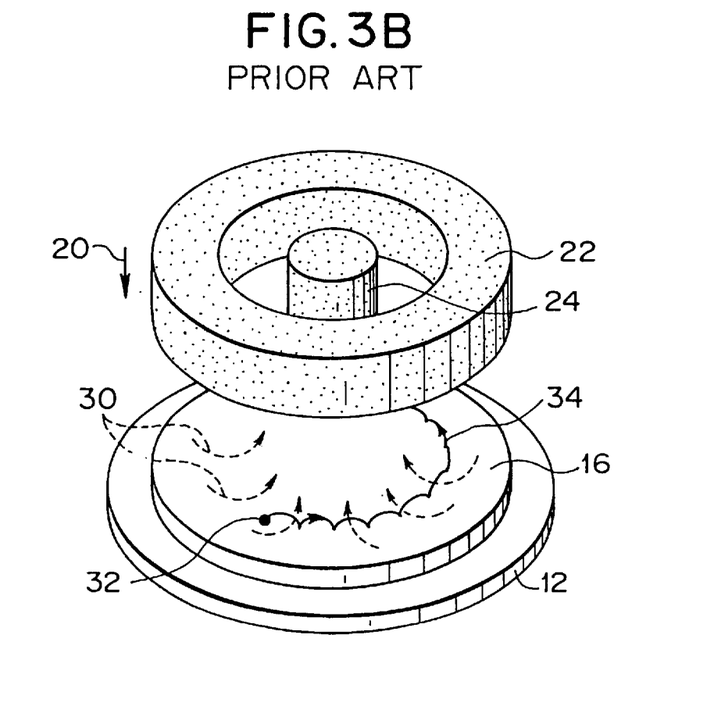
FIG. 3B is a perspective view of the same magnetic field generator showing the drift movement of electrons under application of a vertical electric field.

An example of the conventional etching apparatus by utilizing a magnetron discharge unit is described by making reference to FIGS. 3A and 3B, of which FIG. 3A is a schematic vertical axial cross sectional view of the apparatus and FIG. 3B is for schematic illustration of the movement of electrons therein by a perspective view.

In FIG. 3A, a pair of electrode plates 10,12 are installed up and down in parallel to define a zone therebetween in which plasma is generated as magnetron plasma. A workpiece 16, which may be a semiconductor silicon wafer, is mounted on the lower electrode plate 12 so that the surface of the workpiece 16 is exposed to the magnetron plasma generated in the plasma-generating zone between the electrode plates 10,12. A magnetic field generator for magnetron plasma 18, referred to simply as the magnetic field generator hereinafter, is installed on the upper electrode plate 10 coaxially with the electrode plates 10,12.

The magnetic field generator 18 consists of a combination of concentric two permanent magnets including an annular or ring magnet 22 and a cylindrical core magnet 24, which is concentrically mounted within the center open space of the ring magnet 22, and a yoke 26 which magnetically connects the ring and cylindrical magnets 22,24. The direction of magnetization is reversed between the ring and cylindrical magnets 22,24. In FIG. 3A, for example, the N to S direction of magnetization is down to up for the ring magnet 22 and up to down for the cylindrical magnet 24 so that the magnetic field in the plasma zone, i.e. the space between the electrode plates 10,12, is as shown by he lines of magnetic force 28A,28B. The magnetic field penetrating the upper electrode plate 10 reaches the surface of the workpiece 16 mounted on the lower electrode plate 12 as a leakage magnetic field.

With regard to the electric field, it is usual that a high-frequency voltage is applied between the electrode plates 10,12 so that the plasma zone between the electrode plates 10,12 is under a high-frequency electric field in the up-to-down direction. The downward arrow 20 indicates the direction of the high-frequency electric field at a moment when the upper electrode plate is positive and the lower electrode plate 12 is negative.

The lines of magnetic force 28A, 28B are depicted as the lines 30 in FIG. 3B which is given for schematic perspective illustration of the movement of electrons. Assuming that the direction of the electric field is up to down as indicated by the downward arrow 20, an electron 32 on the surface of the workpiece 16 enters a drift movement under co-action of the magnetic and electric fields to run along the endless track 34 confined to the vicinity of the surface of the workpiece 16 to ionize innumerable gas molecules there. Accordingly, the apparatus illustrated in FIGS. 3A and 3B is suitable for obtaining high-density plasma with an efficiency higher by two to three times than in a plasma-generating apparatus of the high-voltage discharge type.

It should be noted here that contribution of the magnetic field to the drift movement of electrons is obtained only by the component of the magnetic field in the direction perpendicular to the direction of the electric field. In the case of FIGS. 3A and 3B, namely, contribution to the drift movement of electrons and to the ionization of gas molecules is given only by the component of the magnetic field in the direction parallel to the surface of the workpiece 16 or the lower electrode plate 12, which is referred to as the horizontal component hereinafter.

Figure 4:
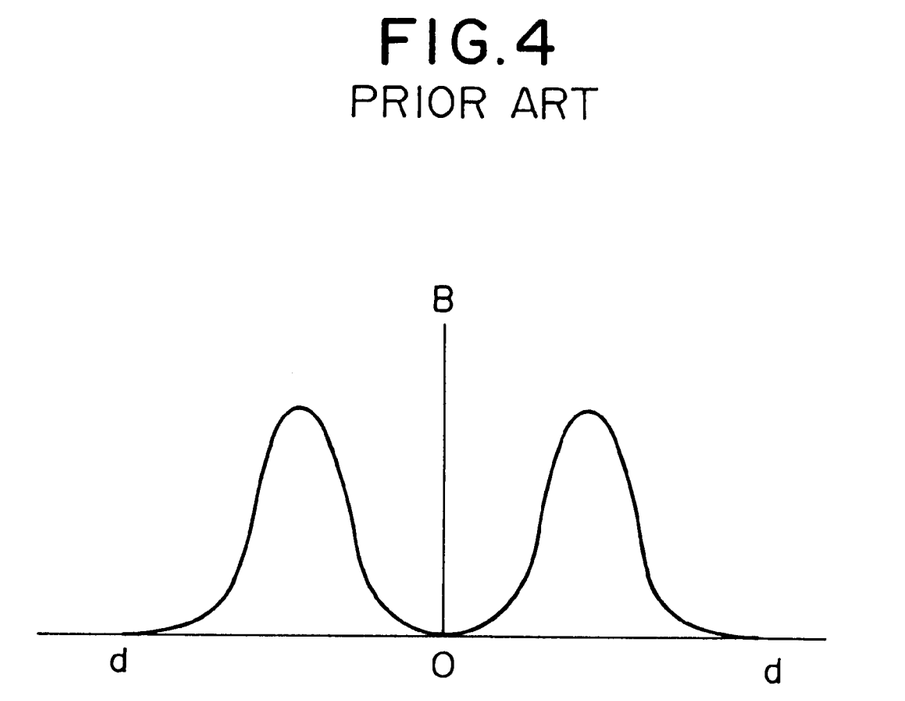
FIG. 4 is a graph showing the distribution of the horizontal component of the magnetic field in the magnetic field generator of FIGS. 3A and 3B as a function of the radial distance from the center

The horizontal component of the magnetic field B, however, is not uniform over the whole surface but greatly varied as a function of the distance d from the axial center point O of the plasma zone as is graphically shown in FIG. 4. Since the density of magnetron plasma depends on the horizontal component B of the magnetic field, the above mentioned situation leads to a serious problem relative to unevenness in the quality of the plasma-treated products such as localization of the effect of etching. In addition, the non-uniform density of the plasma induced there causes a potential difference by charging up within the surface of the workpiece 16 resulting in eventual damage to the workpiece surface.

Figure 5A:
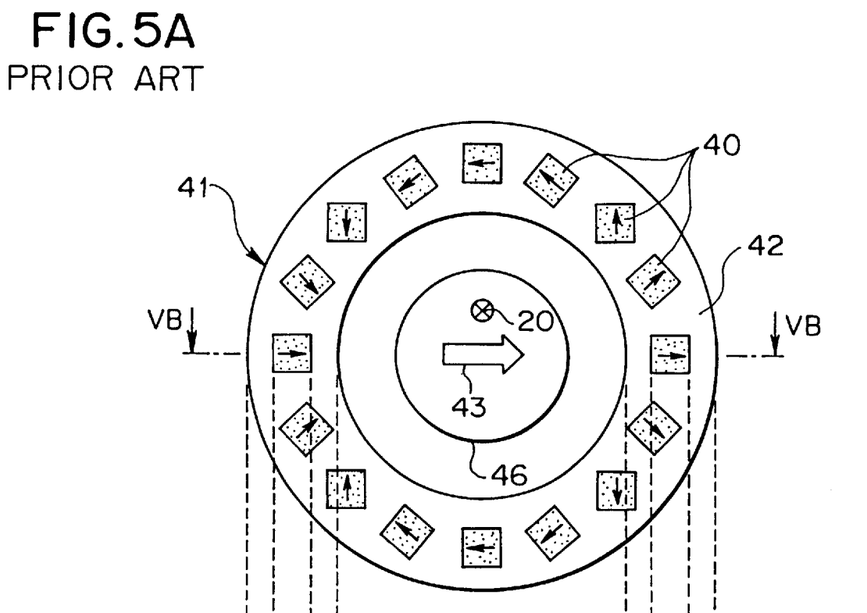
FIG. 5A is a top view of a conventional dipole-ring magnet.

In order to be free from the above described problems, it is desirable that the magnetic field is as uniform as possible and the magnetic field is constituted entirely of the horizontal component only. These requirements can be satisfied, for example, by a magnetic field generator illustrated in FIG. 5A by a top view and in FIG. 5B by a cross sectional view as cut and viewed along the line VB—VB in FIG. 5A. The magnetic field generator of this type is known as a dipole-ring magnet 41 consisting of a plurality, e.g., 16 in FIG. 5A, of magnetically anisotropic, columnar segment magnets 40 embedded in and supported by the non-magnetic cylindrical or tubular framework 42 in such a fashion that each of the columnar segment magnets 40 stands in parallel to the cylindrical axis. The cross sectional profile of each columnar segment 40 magnet is not particularly limitative including circular and rectangular cross sections but can be square as is shown in FIG. 5A. It is essential that the direction of anisotropic magnetization of each segment magnet 40 is within a plane perpendicular to the cylindrical axis and the direction within the plane is varied between two adjacent magnets by an angle of 360°/16 as shown by the small arrow within the square profile of the top view of the magnets 40 in FIG. 5A arranged along a generally circular assembly contour of the 16 columnar magnets 40 completing 360° revolution by one rounding. When a good number of columnar segment magnets 40 each having a sufficiently large length are arranged in this fashion, a uniform magnetic field in the direction indicated by the broad open arrow 43 in FIG. 5A is generated in the space surrounded by the columnar segment magnets 40 in a ring arrangement. The uniformity of the thus generated magnetic field is best within the space 46 at a half height of the length RL of the columnar segment magnets 40.

Figure 5B:
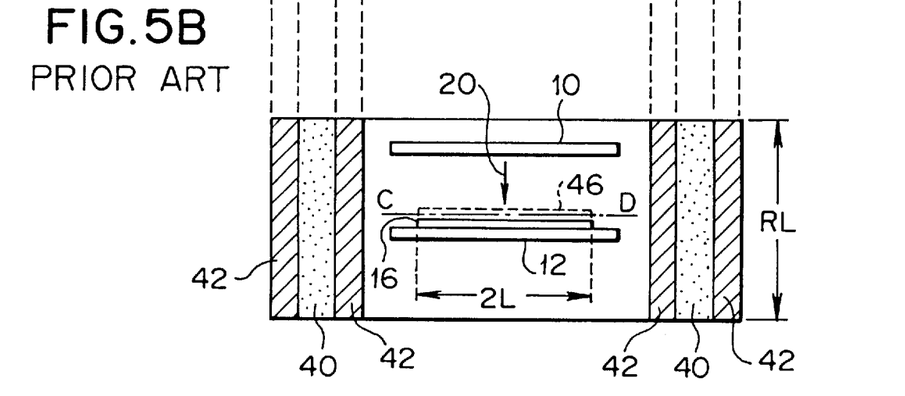
FIG. 5B is an axial cross sectional view of the same dipole-ring magnet as cut and viewed along the line VB—VB in FIG. 5A.

The magnetron plasma generating apparatus is installed with the thus obtained magnetic field with an upper electrode plate 10 and lower electrode plate 12 on which a workpiece 16 is mounted. The downward arrow 20 indicates the direction of the electric field in this plasma generating zone when a high-frequency voltage is applied to the electrode plates 10,12 at a moment when the upper electrode plate 10 is positive and the lower electrode plate 12 is negative.

When a workpiece 16 is set for a plasma treatment, it is advantageous that the surface of the workpiece 16 to be worked is at a height to be within the magnetic field zone 46 of the highest uniformity having a diameter of 2L in order to ensure highest uniformity in the effect obtained by the plasma treatment because the magnetic field within the zone 46 consists substantially of the horizontal component only.

Figure 6:
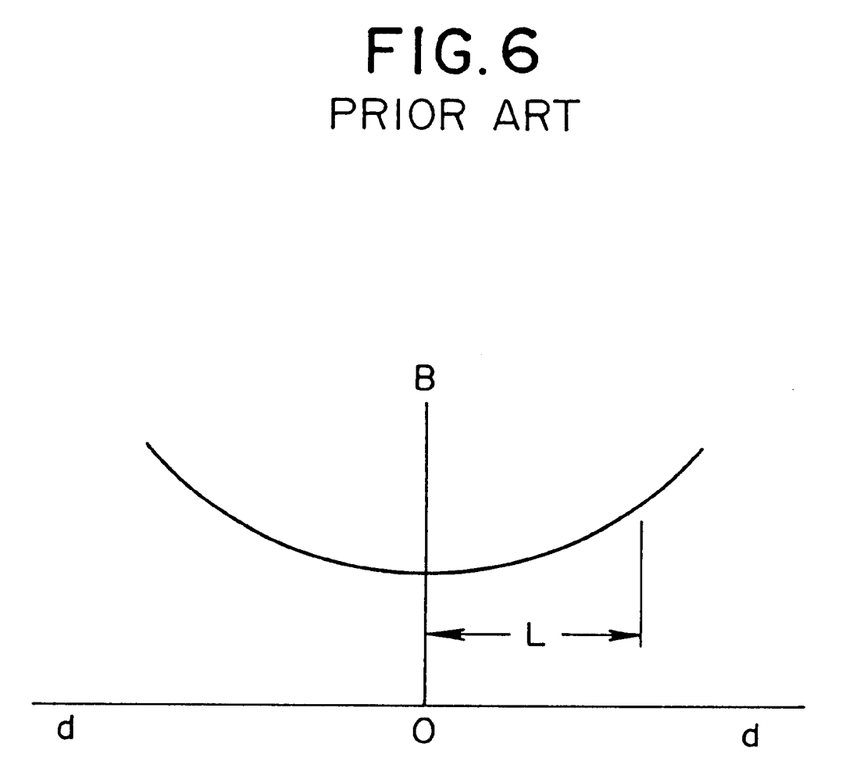
FIG. 6 is a graph showing the distribution of the horizontal magnetic field in the dipole-ring magnet of FIGS. 5A and 5B as a function of the radial distance from the center axis.

FIG. 6 is a graph showing the value B of the horizontal component of the magnetic field within the zone 46 as a function of the radial distance d from the axial center point O within the space 46. As is understood by comparison of the graph of FIG. 6 with the graph of FIG. 4, the uniformity of the magnetic field can be greatly improved in the magnetic field generator of the dipole-ring magnet type as compared with the magnetic field generator illustrated in FIGS. 3A and 3B.

As is described above, good uniformity can be ensured of the magnetic field generated in the magnetic field generator of the dipole-ring magnet type within the zone 46 at the half height of the length RL of the columnar segment magnets 40 assuming that the columnar segment magnets 40 have a sufficiently large length.

When the magnetron plasma treatment of a workpiece 16 by using the magnetic field generator of the dipole-ring magnet type is for the surface treatment of the workpiece 16 such as etching, it is a desirable condition that the zone of uniform horizontal magnetic field is as close as possible to the lower end surface of the magnetic field generator or to the lower ends of the columnar segment magnets 40.

The reason therefor is explained in the following by making reference to FIG. 7 which is a schematic illustration of a typical magnetron plasma etching apparatus as a whole for semiconductor silicon wafers.

Figure 7:
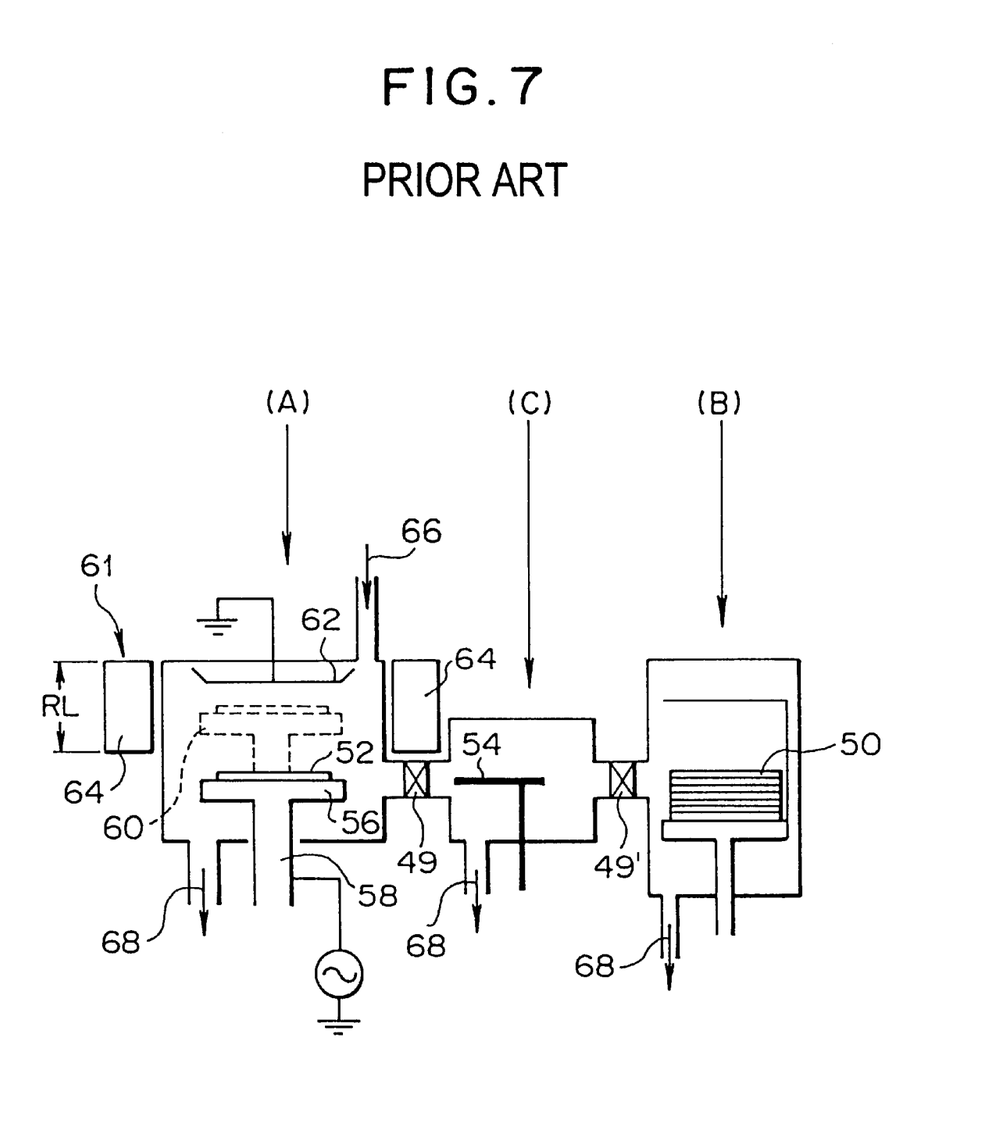
FIG. 7 is a schematic illustration of a plasma treatment system of semiconductor silicon wafers by utilizing a dipole-ring magnet as the magnetic field generator for magnetron plasma generation.

The apparatus of FIG. 7 consists of three parts including a plasma etching chamber (A), a wafer cassette chamber (B) which holds a number of wafers 50 standing by for processing and a load-lock chamber (C) which holds a machine arm 54 for transfer of the wafers 50 from the cassette chamber (B) to the plasma etching chamber (A). The conduits connecting the chambers (C) and (A) and chambers (B) and (C) are provided with valves 49,49', respectively.

A wafer 52, which has been one of the wafers 50 held in the cassette chamber (B) is transferred by means of the machine arm 54 in the load-lock chamber (C) into the plasma etching chamber (A) through the conduits having the valves 49,49'.

The wafer 52 transferred into the etching chamber (A) is mounted on a liftable lower electrode plate 56 supported by a stem 58 followed by lifting of the electrode plate 56 up to the position 60 indicated by the broken line and the wafer 52 thereon to the etching position where the wafer 52 is held within the magnetic field generated by the magnetic field generator 61 of the dipole-ring magnet type and between the upper electrode plate 62 and the lower electrode plate 56(60). The space inside of the etching chamber (A) is filled with a process gas under an appropriate pressure by introducing the gas from the gas inlet 66 and discharging out of the gas outlet 68. When a high-frequency voltage is applied to the electrode plates 56, 62 to form an electric field therebetween, a plasma of the process gas is generated by the interaction of the electric field and the magnetic field to effect the etching treatment of the wafer 52.

While it is a desirable condition in the above described setting of the magnetron plasma etching apparatus that each of the columnar segment magnets 64 of the dipole-ring magnet 61 has a sufficiently large length RL in order to accomplish high uniformity of plasma generation, the length RL in a plasma etching apparatus cannot usually be so large because, since the etching position 60 of the wafer 52 lies in the center cross sectional plane of the dipole-ring magnet 61, the lifting stroke of the stem 58 for lifting of the wafer 52 up to the etching position is necessarily increased with a large length RL of the dipole-ring magnet 61 resulting in a disadvantage of an increased cost for construction involving such a large stroke lift-up mechanism. This is the reason for the conventional design of the dipole-ring magnet having a relatively small length RL undertaken at a sacrifice of the uniformity of the magnetic field.

Another problem encountered in the above described dipole-ring magnet 61 relates to the direction of the magnetic field. Different from the magnetic field explained by making reference to FIGS. 3A and 3B, the magnetic field generated by the dipole-ring magnet is a horizontal magnetic field directed in a single direction. When electrons move within such a unidirectional horizontal magnetic field and the vertical electric field, the drift movement of the electrons is in a single direction and never follows an endless track within a plane parallel to the surface of the workpiece. In order to have the electrons in a drift movement along an endless track in the circumferential direction, the apparatus must be provided with a mechanism for rotating the dipole-ring magnet around the axis.

While such a mechanism for rotating the dipole-ring magnet can be constructed by using a bearing, e.g., ball bearing, on which the dipole-ring magnet is mounted, a disturbance is unavoidable on the distribution of the magnetic field by the use of a mechanism with a bearing since the material of bearings is usually a steel which is a ferromagnetic material eventually to disturb the magnetic field within the plasma generating space. Although this trouble can be overcome by the use of a bearing formed from a non-magnetic material, such a non-magnetic bearing is usually very expensive as compared with magnetic steel bearings leading to expensiveness of the apparatus.

SUMMARY OF THE INVENTION

The present invention accordingly has an object, in view of the above described problems and disadvantages in the dipole-ring magnets of the prior art, to provide an improved dipole-ring magnet as a magnetic field generator in a magnetron plasma generating apparatus, of which the generated magnetic field has improved uniformity in the space below the half-height level of the length of the columnar segment magnets forming the dipole-ring magnet so that the plasma-generating zone can be set in the lower part of the magnetic field zone enabling a decrease in the lift-up stroke of the stem 58 in the etching chamber (A) of the apparatus illustrated in FIG. 7.

Thus, the present invention provides an improvement, in a dipole-ring magnet as a magnetic field generator in a magnetron plasma generating apparatus comprising a plurality of magnetically anisotropic columnar segment magnets of an equal length standing in parallel with the end surfaces of the segment magnets arranged along a circular contour, which comprises mounting a ring member of a ferromagnetic material on or above the upper end surfaces of the columnar segment magnets in direct contact therewith or by keeping a gap therewith.

DETAILED DESCRIPTION OF THE PREFERRED EMBODIMENTS

Figure 1A:
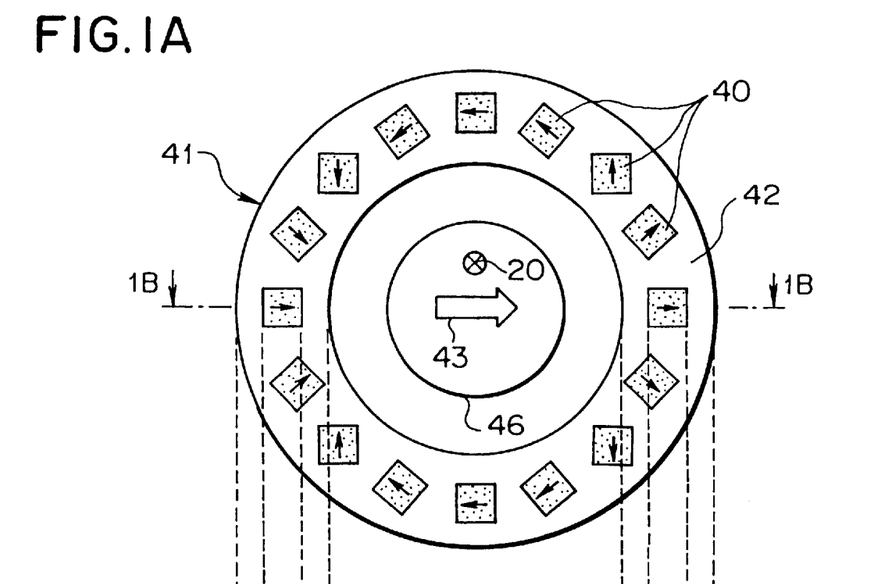
FIG. 1A is a top view of the dipole-ring magnet according to the invention with the magnetic ring member removed for visibility.
Figure 1B:
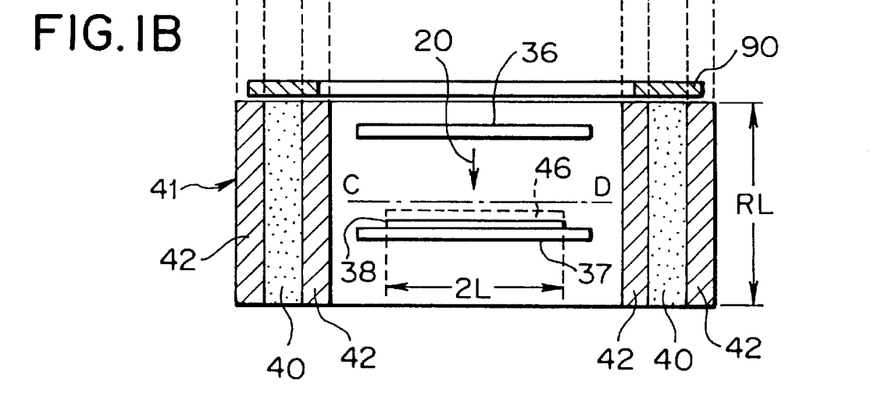
FIG. 1B is a vertical cross sectional view of the same dipole-ring magnet with a magnetic ring member mounted as cut and viewed along the line IB—IB in FIG. 1A.

Although the dipole-ring magnet per se according to the invention illustrated in FIGS. 1A and 1B is not particularly different from that illustrated in FIGS. 5A and 5B, a quite unexpected improvement can be accomplished in the distribution of the magnetic field generated by the dipole-ring magnet by merely mounting a magnetic ring member 90 in direct contact with or by keeping a gap space with the upper end surfaces of the columnar segment magnets 40 as is shown in FIG. 1B by a vertical axial cross sectional view. The improvement in the magnetic field distribution accomplished according to the invention is described by making reference to FIGS. 2A, 2B and 2C each showing the lines of magnetic force generated by the magnetic field generator, of which FIG. 2A is for the conventional dipole-ring magnet illustrated in FIGS. 5A and 5B.

Figure 2A:
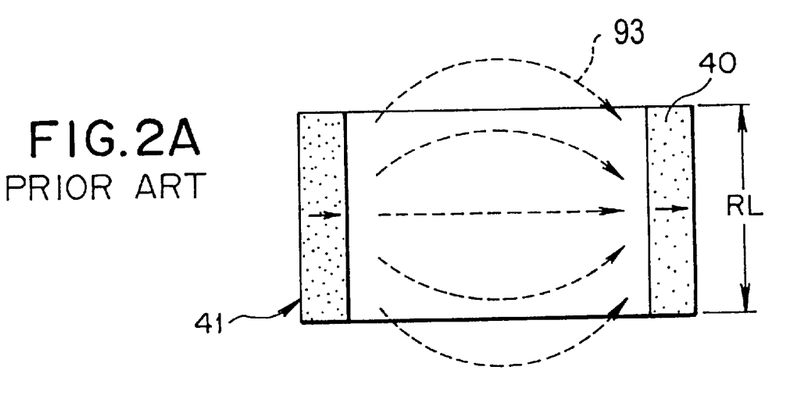
FIG. 2A shows the line s of magnetic force generated in a conventional dipole-ring magnet.

The curves 92 in FIG. 2A are the lines of magnetic force generated in the space, i.e. the magnetic field zone, surrounded by the conventional dipole-ring magnet 41 illustrated in FIGS. 5A and 5B. As is shown in FIG. 2A, the magnetic field is completely horizontal within a plane, referred to as the horizontal-field plane hereinafter, at a half height of the length RL of the columnar segment magnets 40 and the distribution of the magnetic field above and below the horizontal-field plane is symmetrical relative to the plane.

Figure 2B:
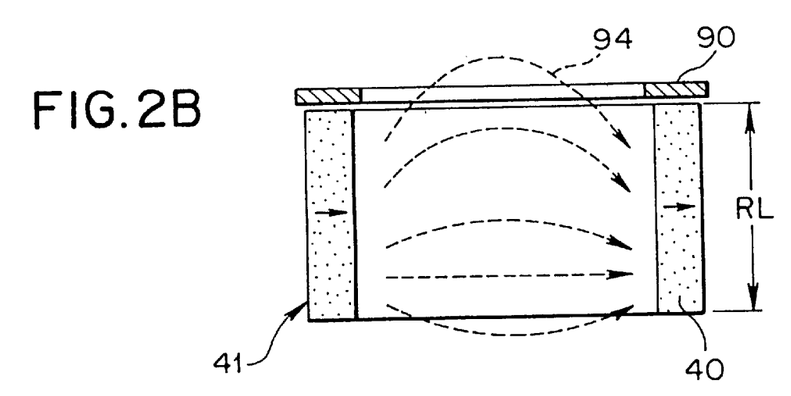
FIG. 2B shows the lines of magnetic force generated in a dipole-ring magnet with a flat magnetic ring member mounted according to the invention.

When a flat magnetic ring member 90 is mounted on or above the upper end surfaces of the columnar segment magnets 40 without or by keeping a gap space with the upper end surfaces of the segment magnets 40, as is shown in FIG. 2B, the height of the horizontal-field plane shifts downwardly so that the horizontal-field plane approaches the lower end surfaces of the columnar segment magnets 40. The distribution of the magnetic field above and below the horizontal-field plane is no longer symmetrical relative to the plane.

Figure 2C:
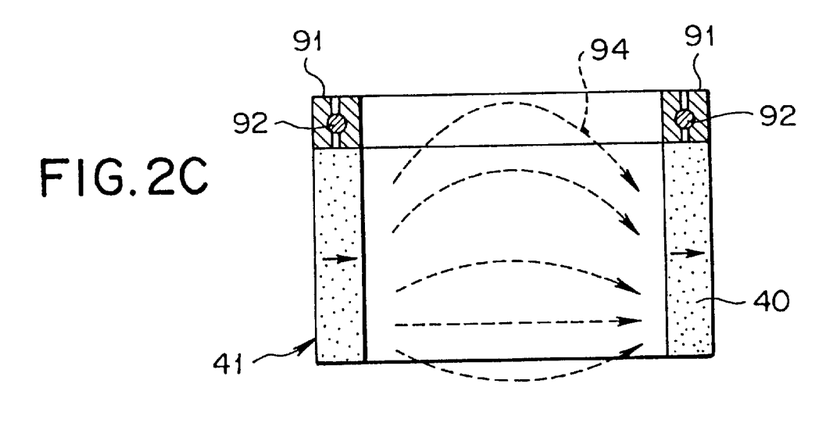
FIG. 2C shows the lines of magnetic force generated in a dipole-ring magnet with a magnetic ring member held in a holder according to the invention.

FIG. 2C illustrates a similar arrangement in which the magnetic ring member 92 is contained in a holder 91 which is mounted on the upper end surfaces of the columnar segment magnets 40. The effect on the distribution of the magnetic field is about the same as in the arrangement shown in FIG. 2B.

The ferromagnetic material forming the magnetic ring member 90 or 92 is not particularly limitative but preferably selected from iron, nickel and cobalt as well as alloys of these metallic elements, carbon steels and certain cemented metal carbides such as tungsten carbide particles cemented with cobalt or nickel.

When the magnetic ring member 90 is mounted above the upper end surfaces of the columnar segment magnets 40 by keeping a gap therebetween, the height of the gap should not exceed 30% of the length of the segment magnets 40. The size of the magnetic ring member 90 is selected such that the ring member 90 has a volume in the range from 10 to 60% of the total volume of the columnar segment magnets 40 forming the dipole-ring magnet. When the volume is too small, the desired improvement to be accomplished by the present invention cannot be fully exhibited as a matter of course while, when too large, a decrease is caused in the magnetic field in the dipole-ring magnet.

EXAMPLE 1

A dipole-ring magnet 41 having a magnetic ring member 90 as illustrated in FIGS. 1A and 1B was constructed.

Each of the 16 columnar segment magnets 40 forming the dipole-ring magnet 41 was a magnetically anisotropic neodymium/iron/boron-based permanent magnet having a height RL of 110 mm and a 40 mm by 40 mm square cross section with the axis of easy magnetization in the direction perpendicular to the lengthwise direction. The magnetic ring member 90 made from iron and mounted on the upper end surfaces of the columnar segment magnets 40 in direct contact therewith had an outer diameter of 560 mm, inner diameter of 510 mm and thickness of 20 mm As a result of the measurements of the lines of magnetic force 94 as illustrated in FIG. 2B within the space surrounded by the dipole-ring magnet 41 with the above mentioned magnetic ring member 90, it was found that the height of the horizontal-field plane was lower by 5 mm than the half height level of the columnar segment magnets 40 as was the case when the lines of magnetic force 92 were measured by removing the magnetic ring member 90 as is shown in FIG. 2A.

EXAMPLE 2

The dipole-ring magnet 41 per se was just the same as in Example 1 but, instead of mounting the magnetic ring member 90 in direct contact with the upper end surfaces of the columnar segment magnets 40, a magnetic iron holder 91 in the form of a bearing holding a ring member 92 of iron having the same weight as the flat magnetic ring member 90 in Example 1 was mounted on the upper end surfaces of the columnar segment magnets 40 as is illustrated in FIG. 2C.

The result of the measurements of the lines of magnetic force was about the same as in Example 1 with 5 mm of downward shift of the horizontal field plane. Further, the holder 91 could be built in the mechanism for revolution of the dipole-ring magnet 41 and could serve as a bearing without problems.

What is claimed is:

1. A magnetic field generator for use in a magnetron plasma generating apparatus, said magnetic field generator comprising:

a dipole-ring magnet including magnetically anisotropic columnar segment magnets of substantially equal length arranged parallel to one another in a circular configuration, with each of said magnetically anisotropic columnar segment magnets having a direction of magnetization that is perpendicular to the length of said magnetically anisotropic columnar segment magnets; and a ferromagnetic ring member positioned above and in contact with end surfaces of said magnetically anisotropic columnar segment magnets.

2. The magnetic field generator according to claim 1, wherein said ferromagnetic ring member has a volume in the range of from 10% to 60% of the total volume of said magnetically anisotropic columnar segment magnets.

3. The magnetic field generator according to claim 1, wherein said ferromagnetic ring member includes a ferromagnetic annular member and a ferromagnetic holder in which is installed said ferromagnetic annular member.

4. The magnetic field generator according to claim 3, wherein said ferromagnetic holder comprises a bearing.

5. The magnetic field generator according to claim 1, wherein said ferromagnetic ring member is positioned above end surfaces of said magnetically anisotropic columnar segment magnets such that the end surfaces of said magnetically anisotropic columnar segment magnets are substantially completely covered by said ferromagnetic ring member.

6. The magnetic field generator according to claim 1, wherein no ferromagnetic ring member is positioned below end surfaces of said magnetically anisotropic columnar segment magnets that are opposite to the end surfaces of said magnetically anisotropic columnar segment magnets above which is provided said ferromagnetic ring member.

7. A magnetic field generator for use in a magnetron plasma generating apparatus, said magnetic field generator comprising:

a dipole-ring magnet including magnetically anisotropic columnar segment magnets of substantially equal length arranged parallel to one another in a circular configuration, with each of said magnetically anisotropic columnar segment magnets having a direction of magnetization that is perpendicular to the length of said magnetically anisotropic columnar segment magnets; and a ferromagnetic ring member positioned above and spaced from end surfaces of said magnetically anisotropic columnar segment magnets wherein said ferromagnetic ring member includes a ferromagnetic annular member and a ferromagnetic holder in which is installed said ferromagnetic annular member.

8. The magnetic field generator according to claim 1, wherein said ferromagnetic holder comprises a bearing.

9. A magnetic field generator for use in a magnetron plasma generating apparatus, said magnetic field generator comprising:

a dipole-ring magnet including magnetically anisotropic columnar segment magnets of substantially equal length arranged parallel to one another in a circular configuration, with each of said magnetically anisotropic columnar segment magnets having a direction of magnetization that is perpendicular to the length of said magnetically anisotropic columnar segment magnets; and a ferromagnetic ring member positioned above end surfaces of said magnetically anisotropic columnar segment magnets, wherein said ferromagnetic ring member includes a ferromagnetic annular member and a ferromagnetic holder in which is installed said ferromagnetic annular member.

10. The magnetic field generator according to claim 5, wherein said ferromagnetic holder comprises a bearing.

* * * * *